(12) United States Patent
Noguchi et al.

(10) Patent No.: US 6,984,459 B1
(45) Date of Patent: Jan. 10, 2006

(54) POLYMERIC FLUORESCENT SUBSTANCE AND POLYMER LIGHT EMITTING DEVICE

(75) Inventors: Takanobu Noguchi, Tsukuba (JP); Shuji Doi, Tsukuba (JP); Makoto Kitano, Toyonaka (JP)

(73) Assignee: Sumito Chemical Company, Limited, Osaka (JP)

( * ) Notice: Subject to any disclaimer, the term of this patent is extended or adjusted under 35 U.S.C. 154(b) by 0 days.

(21) Appl. No.: 09/630,407

(22) Filed: Aug. 1, 2000

(30) Foreign Application Priority Data

Aug. 3, 1999 (JP) ................................. 11-219996

(51) Int. Cl.
*H05B 33/14* (2006.01)
*C09K 11/06* (2006.01)
*C08G 61/02* (2006.01)

(52) U.S. Cl. ...................... 428/690; 428/917; 313/504; 313/506; 257/40; 257/103; 526/294; 528/394; 528/397; 252/301.35

(58) Field of Classification Search .............. 428/690, 428/917; 313/504, 506; 257/40, 103; 526/239, 526/293, 294, 296; 528/394, 397; 252/301.35
See application file for complete search history.

(56) References Cited

U.S. PATENT DOCUMENTS

| | | | | | |
|---|---|---|---|---|---|
| 5,759,709 A | * | 6/1998 | Doi et al. | ................... | 428/690 |
| 5,777,070 A | * | 7/1998 | Inbasekaran et al. | ....... | 528/394 |
| 6,124,046 A | * | 9/2000 | Jin et al. | ................... | 428/690 |

FOREIGN PATENT DOCUMENTS

| | | |
|---|---|---|
| JP | 05-202355 A | 8/1993 |
| JP | 09-045478 A | 2/1997 |
| JP | 11-140168 A | 5/1999 |

OTHER PUBLICATIONS

Zhang et al., "Efficient light-emitting diodes from blends of conjugated polymers," in Organic Light-Emitting Materials and Devices, Zakya H. Kafafi, Editor, Proceedings of SPIE vol. 3148, pp. 89-101 (1997).*

Kim et al., "LED Characterization of an Alternating Copolymer and its Blends," in Organic Light-Emitting Materials and Devices, Zakya H. Kafafi, Editor, Proceedings of SPIE vol. 3148, pp. 151-158 (1997).*

* cited by examiner

*Primary Examiner*—Marie Yamnitzky
(74) *Attorney, Agent, or Firm*—Sughrue Mion, PLLC

(57) ABSTRACT

Provided is a polymeric fluorescent substance containing specific proportion of a repeating unit comprising 2 to 5 arylene groups or heterocyclic compound groups. The polymeric fluorescent substance has strong fluorescence, and can be suitably used as a polymer for high performance polymer LED and a dye for laser.

12 Claims, No Drawings

POLYMERIC FLUORESCENT SUBSTANCE AND POLYMER LIGHT EMITTING DEVICE

BACKGROUND OF THE INVENTION

1. Field of the Invention

The present invention relates to a polymeric fluorescent substance, a polymer light emitting device (hereinafter, referred to as polymer LED) containing the same in an light emitting layer, and a device using the same.

2. Description of the Related Art

Inorganic electroluminescence devices (hereinafter, sometimes referred to as inorganic EL device) using an inorganic luminescent material as a light emitting material are used for example for flat light sources as back-lights and displays such as a flat panel display and the like, however, an alternating current of high voltage has been required for light emission.

Recently, Tang et al. fabricated an organic electroluminescence device (hereinafter, sometimes referred to as organic EL device) having a double-layer structure in which an organic fluorescent dye as a light emitting layer is laminated with an organic charge transport compound used in photosensitive layer for electrophotography and the like (Japanese Patent Application Laid-Open (JP-A) No. 59-194393). Since organic EL devices have characteristics that light emissions of a lot of colors are obtained easily in addition to low voltage driving and high luminance as compared with inorganic EL devices, there have been reported a lot of trials regarding device structures, organic fluorescent dyes and organic charge transport compounds of organic EL devices [Jpn. J. Appl. Phys., 27, L269 (1988), J. Appl. Phys., 65, 3610 (1989)].

Further, apart from organic EL devices using mainly organic compounds having a lower molecular weight, polymer light emitting devices (hereinafter, sometimes referred to as polymer LEDs) using light emitting materials having a higher molecular weight have been proposed in such as WO 9013148 published specification, JP-A No. 3-244630, Appl. Phys. Lett., 58, 1982 (1991) WO 9013148 discloses in the Examples an EL device using a thin film of poly(p-phenylene vinylene) obtained by forming a film of a soluble precursor on the electrode and subjecting it to a heat treatment to convert the precursor into a conjugated polymer.

Further, JP-A 3-244630 has exemplified conjugated polymer having a feature that they are themselves soluble in a solvent and need no heat treatment. Also in Appl. Phys. Lett., 58, 1982 (1991), a polymeric light emitting materials soluble in a solvent and a polymer LED fabricated using the same are described.

Polymer LEDs are advantageous for formation of a film having large area and reduction in cost since an organic layer can be easily formed by coating, as compared with the case of vapor deposition of a material having a lower molecular weight, and the mechanical strength of the resulting film is believed to be high because of a high molecular weight thereof.

Conventionally, as the light emitting materials used in these polymer LEDs, there have been reported polyfluorene (Jpn. J. Appl. Phys., 30, L1941 (1991)), poly p-phenylene derivative (Adv. Mater., 4, 36 (1992)) and the like, in addition to the above-described poly(p-phenylene vinylene).

Japanese Patent Application Laid-Open (JP-A) No. 5-202355 describes a polymeric fluorescent substance comprising a copolymer composed of 2 or more arylenevinylene repeating units, and as the arylene group, a biphenylene group and terphenylene group are exemplified.

JP-A No. 11-97175 describes a polyarylenevinylene composed of an arylene group or aromatic heterocyclic group substituted with two or more aryl groups or aromatic heterocyclic groups, and as the arylene group, a biphenylene group and terphenylene group are also exemplified.

JP-A No. 11-140168 describes a poly(substituted biphenylenevinylene) and a production method thereof.

JP-A No. 11-502248 describes a polymer containing an oligo-p-phenylene unit and a production method thereof.

JP-A No. 10-36487 describes an alternating copolymer of fluorenevinylene and arylenevinylene.

Though various polyarylenevinylenes and copolymers thereof have thus been disclosed as a polymeric fluorescent substance used on polymer LED, polymeric fluorescent substances which emits a further strong fluorescence have been required.

The object of the present invention is to provide a polymeric fluorescent substance emitting strong fluorescence, a polymer LED and a device having high performance which can be driven at low voltage at high efficiency by using the polymeric fluorescent substance.

SUMMARY OF THE INVENTION

The present inventors have intensively investigated in view of such conditions, and resultantly found that a polymeric fluorescent substance containing specific proportion of a repeating unit comprising 2 to 5 arylene groups or heterocyclic compound groups connected manifests stronger fluorescence, and that by using this polymeric fluorescent substance, a high performance polymer LED which can be driven at lower voltage and at higher efficiency is obtained, leading to the completion of the present invention.

Namely, the present invention relates to

[1] A polymeric fluorescent substance which emits a fluorescence in solid state and having a number-average molecular weight of $10^3$ to $10^8$ in terms of polystyrene, wherein the substance contains each one or more of repeating units represented by the following formula (1) and formula (3), respectively, and these repeating units are so selected as to satisfy the following conditions (a) to (c):

(a): the total amount of the repeating units represented by the formulae (1) and (3) is 50 mol % or more of the amount of the whole repeating units, (b): the amount of the repeating unit represented by the formula (3) is more than 0.1 mol % and less than 9 mol % based on the total amount of the repeating units represented by the formula (1) and formula (3), and (c): when the absorption edge wavelength of a polymer solely composed of a repeating unit represented by the formula (1) is represented by $\lambda_1$ (nm) and the absorption edge wavelength of a polymer solely composed of a repeating unit represented by the formula (3) is represented by $\lambda_2$ (nm), the following relation is satisfied:

$$1239/\lambda_1 \geq 1239/\lambda_2 + 0.05$$

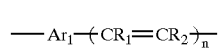

(1)

[Wherein, $Ar_1$ is a group represented by the following formula (2). $R_1$ and $R_2$ each independently represents a group selected from the group consisting of a hydrogen atom, alkyl group having 1 to 20 carbon atoms, aryl group having 6 to 60 carbon atoms, heterocyclic compound group having 4 to 60 carbon atoms and cyano group. n is 0 or 1.]

  (2)

[Wherein, $Ar_2$ to $Ar_4$ each independently represents an arylene group having 6 to 60 carbon atoms contained in the main chain, or a heterocyclic compound group having 4 to 60 carbon atoms contained in the main chain. At least one of $Ar_2$ to $Ar_4$ is a group other than a 6-membered ring, or at least one of $Ar_2$ to $Ar_4$ has a substituent other than a hydrogen atom. When a plurality of substituents are carried, they may be the same or different. Adjacent rings may be mutually connected directly or via a substituent to form a ring. m is an integer from 0 to 3. Wherein, $Ar_2$ and $Ar_4$ constitute a structure wherein if $Ar_2$ moves in parallel to the polymer main chain, it does not completely overlap $Ar_4$.]

  (3)

[Wherein, $Ar_5$ represents an arylene group having 6 to 60 carbon atoms contained in the main chain, or a heterocyclic compound group having 4 to 60 carbon atoms contained in the main chain. $R_3$ and $R_4$ each independently represents a group selected from the group consisting of a hydrogen atom, alkyl group having 1 to 20 carbon atoms, aryl group having 6 to 60 carbon atoms, heterocyclic compound group having 4 to 60 carbon atoms and cyano group. l is 0 or 1.]

Further, the present invention relates to

[2] A polymeric fluorescent substance which emits a fluorescence in solid state and having a number-average molecular weight of to $10^3$ to $10^8$ in terms of polystyrene, wherein the substance contains each one or more of repeating units represented by the following formula (1), formula (3) and formula (4), respectively, and these repeating units are so selected as to satisfy the following conditions (d) to (f):

(d): the amount of the repeating unit represented by the formula (1) is 10 mol % or more of the amount of the whole repeating units, and the total amount of the repeating units represented by the formula (1), formula (3) and formula (4) is 50 mol % or more of the amount of the whole repeating units, (e): the amount of the repeating unit represented by the formula (3) is more than 0.1 mol % and less than 9 mol % based on the total amount of the repeating units represented by the formula (1), formula (3) and formula (4), and (f): when the absorption edge wavelength of a polymer solely composed of a repeating unit represented by the formula (1) is represented by $\lambda_1$ (nm), the absorption edge wavelength of a polymer solely composed of a repeating unit represented by the formula (3) is represented by $\lambda_2$ (nm) and the absorption edge wavelength of a polymer solely composed of a repeating unit represented by the formula (4) is represented by $\lambda_3$ (nm), the following relations are satisfied:

$$1239/\lambda_1 \geq 1239/\lambda_2 + 0.05 \quad (4)$$
$$1239/\lambda_3 \geq 1239/\lambda_2 + 0.05$$

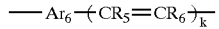

[Wherein, $Ar_6$ is an arylene group having 6 to 60 carbon atoms contained in the main chain, or a heterocyclic compound group having 4 to 60 carbon atoms contained in the main chain. $R_5$ and $R_6$ each independently represents a group selected from the group consisting of a hydrogen atom, alkyl group having 1 to 20 carbon atoms, aryl group having 6 to 60 carbon atoms, heterocyclic compound group having 4 to 60 carbon atoms and cyano group. k is 0 or 1.]

Further, the present invention relates to

[3] The polymeric fluorescent substance according to claim 1 wherein the group represented by said formula (2) is a group represented by the following formula (5):

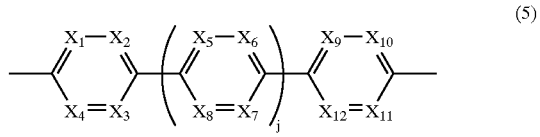  (5)

[Wherein, $X_1$ to $X_{12}$ each independently represents C—$R_7$ or N, and at least one of $X_1$ to $X_{12}$ is C—$R_7$. Wherein, $R_7$ represents a group selected from the group consisting of a hydrogen atom, alkyl group having 1 to 20 carbon atoms, alkoxy group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, arylamino group having 6 to 60 carbon atoms, heterocyclic compound group having 4 to 60 carbon atoms and cyano group. At least one $R_7$ is a group other than a hydrogen atom. When a plurality of $R_7$'s are present, they may be the same or different.

The group represented by the formula (5) has at least one substituent other than a hydrogen atom, and when the group (5) has a plurality of substituents, they may be the same or different. Adjacent 6-membered rings may be mutually connected directly or via a substituent to form a ring. j is an integer from 0 to 3. Wherein, $X_1$ and $X_9$, $X_2$ and $X_{10}$, $X_3$ and $X_{11}$, and $X_4$ and $X_{12}$ are not respectively the same simultaneously, and $X_1$ and $X_{12}$, $X_2$ and $X_{11}$, $X_3$ and $X_{10}$, and $X_4$ and $X_9$ are not respectively the same simultaneously.]

Further, the present invention relates to

[4] The polymeric fluorescent substance according to claim 3 wherein j=0 in said formula (5).

Further, the present invention relates to

[5] a polymer light emitting device comprising a pair of electrodes composed of an anode and a cathode at least one of which is transparent or semitransparent and at least one light emitting layer disposed between the electrodes, wherein the polymeric fluorescent substance of any of [1] to [4] is contained in the above-described light emitting layer.

[6] the polymer light emitting device according to [5] wherein a layer containing an conducting polymer is disposed at least between one electrode and the light emitting layer so that the layer containing an conducting polymer is adjacent to the above-described electrode.

Further, the present invention relates to

[7] the polymer light emitting device according to [5] wherein an insulation layer having a thickness of 2 nm or less is disposed at least between one electrode and the light emitting layer so that the insulation layer is adjacent to the above-described electrode.

Further, the present invention relates to

[8] the polymer light emitting device according to any of [5] to [7] wherein a layer comprising an electron transporting compound is disposed between the cathode and the light emitting layer so that the layer comprising an electron transporting compound is adjacent to the above-described light emitting layer.

Further, the present invention relates to [9] the polymer light emitting device according to any of [5] to [7] wherein a layer comprising a hole transporting compound is disposed between the anode and the light emitting layer so that the layer comprising a hole transporting compound is adjacent to the above-described light emitting layer.

Further, the present invention relates to

[10] the polymer light emitting device according to any of [5] to [7] wherein a layer comprising an electron transporting compound is disposed between the cathode and the light emitting layer so that the layer comprising an electron transporting compound is adjacent to the above-described light emitting layer, and a layer comprising a hole transporting compound is disposed between the anode and the light emitting layer so that the layer comprising a hole transporting compound is adjacent to the above-described light emitting layer.

Further, the present invention relates to

[11] a flat light source obtained by using the polymer light emitting device of any of [5] to [10].

Further, the present invention relates to

[12] a segment display obtained by using the polymer light emitting device of any of [5] to [10].

Further, the present invention relates to

[13] a dot matrix display obtained by using the polymer light emitting device of any of [5] to [10].

Further, the present invention relates to

[14] a liquid crystal display obtained by using the polymer light emitting device of any of [5] to [10] as a backlight.

DETAILED DESCRIPTION OF THE INVENTION

The polymeric fluorescent substance and a polymer LED using the same will be described in detail below.

The polymeric fluorescent substance of the present invention is a polymeric fluorescent substance which emits a fluorescence in solid state and having a number-average molecular weight of $10^3$ to $10^8$ in terms of polystyrene, wherein the substance contains each one or more of repeating units represented by the above-described formula (1) and formula (3), respectively, and these repeating units are so selected as to satisfy the following conditions (a) to (c):

(a): the total amount of the repeating units represented by the formulae (1) and (3) is 50 mol % or more of the amount of the whole repeating units, (b): the amount of the repeating unit represented by the formula (3) is more than 0.1 mol % and less than 9 mol % based on the total amount of the repeating units represented by the formula (1) and formula (3), and (c): when the absorption edge wavelength of a polymer solely composed of a repeating unit represented by the formula (1) is represented by $\lambda_1$ (nm) and the absorption edge wavelength of a polymer solely composed of a repeating unit represented by the formula (3) is represented by $\lambda_2$ (nm), the following relation is satisfied:

$$1239/\lambda_1 \geq 1239/\lambda_2 + 0.05.$$

It is preferable that any one or more of the following conditions (a') to (c') are satisfied, more preferably three of them are satisfied, in addition to the above-mentioned conditions (a) to (c), depending on the structure of the repeating unit:

(a'): the total amount of the repeating units represented by the formulae (1) and (3) is 70 mol % or more of the amount of the whole repeating units, (b'): the amount of the repeating unit represented by the formula (3) is more than 0.2 mol % and less than 8 mol % based on the total amount of the repeating units represented by the formula (1) and formula (3), and (c'): the following relation is satisfied:

$$1239/\lambda_1 \geq 1239/\lambda_2 + 0.07.$$

Another polymeric fluorescent substance of the present invention is a polymeric fluorescent substance which emits a fluorescence in solid state and having a number-average molecular weight $10^3$ to $10^8$ in terms of polystyrene of, wherein the substance contains each one or more of repeating units represented by the following formula (1), formula (3) and formula (4), respectively, and these repeating units are so selected as to satisfy the following conditions (d) to (f):

(d): the amount of the repeating unit represented by the formula (1) is 10 mol % or more of the amount of the whole repeating units, and the total amount of the repeating units represented by the formula (1), formula (3) and formula (4) is 50 mol % or more of the amount of the whole repeating units, (e): the amount of the repeating unit represented by the formula (3) is more than 0.1 mol % and less than 9 mol % based on the total amount of the repeating units represented by the formula (1), formula (3) and formula (4), and (f): when the absorption edge wavelength of a polymer solely composed of a repeating unit represented by the formula (1) is represented by $\lambda_1$ (nm), the absorption edge wavelength of a polymer solely composed of a repeating unit represented by the formula (3) is represented by $\lambda_2$ (nm) and the absorption edge wavelength of a polymer solely composed of a repeating unit represented by the formula (4) is represented by $\lambda_3$ (nm), the following relations are satisfied:

$$1239/\lambda_1 \geq 1239/\lambda_2 + 0.05$$
$$1239/\lambda_3 \geq 1239/\lambda_2 + 0.05.$$

It is preferable that any one or more of the following conditions (d') to (f') are satisfied, more preferably three of them are satisfied, in addition to the above-mentioned conditions (d) to (f), depending on the structure of the repeating unit:

(d): the amount of the repeating unit represented by the formula (1) is 20 mol % or more of the amount of the whole repeating units, and the total amount of the repeating units represented by the formula (1), formula (3) and formula (4) is 70 mol % or more of the amount of the whole repeating units, (e): the amount of the repeating unit represented by the formula (3) is more than 0.2 mol % and less than 8 mol % based on the total amount of the repeating units represented by the formula (1), formula (3) and formula (4), and (f'): the following relations are satisfied:

$$1239/\lambda_1 \geq 1239/\lambda_2 + 0.07$$
$$1239/\lambda_3 \geq 1239/\lambda_2 + 0.07.$$

$Ar_1$ is a group formed by connecting 2 to 5 arylene groups or heterocyclic compound groups represented by the formula (2). These groups are characterized by the position and bonding direction of a substituent on an arylene group or heterocyclic compound group at the both ends thereof, and $Ar_2$ and $Ar_4$ constitute a structure wherein if $Ar_2$ moves in parallel, it does not overlap $Ar_4$. Namely, both end groups have mutually different skeleton rings, alternatively, if they have the same ring, different substituents are carried, or, even if the same substituent is carried on the same ring, the bonding number and position thereof are different and when the single bond of the main chain rotate, they do not show the same structure and direction. That is, they are different from those which are formed by connecting 2 to 5 of one kind of arylene group or heterocyclic compound group.

One preferable example include groups formed by connecting 2 to 5 6-membered rings represented by the above-described formula (5) mutually at 1,4-position. These groups are characterized by the position of a substituent and the presence or absence and position of N, and different from those obtained by connecting 2 to 5 one kind of 6-membered rings.

When $Ar_1$ in the above-described formula (1) is a group represented by the above-described formula (5), it is a divalent group formed by connecting mutually 2 to 5 6-membered aromatic rings. Wherein, $X_1$ to $X_{12}$ each independently represents C—$R_7$ or N, and at least one of $X_1$ to $X_{12}$ is C—$R_7$. Wherein, $R_7$ represents a group selected from the group consisting of a hydrogen atom, alkyl group having 1 to 20 carbon atoms, alkoxy group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, arylamino group having 6 to 60 carbon atoms, heterocyclic compound group having 4 to 60 carbon atoms and cyano group. At least one $R_7$ is a group other than a hydrogen atom. When a plurality of $R_7$s are present, they may be the same or different.

Further, adjacent 6-membered rings may be mutually connected directly or via a substituent to form a ring. j is an integer from 0 to 3. Wherein, $X_1$ and $X_9$, $X_2$ and $X_{10}$, $X_3$ and $X_{11}$, and $X_4$ and $X_{12}$ are not respectively the same simultaneously, and $X_1$ and $X_{12}$, $X_2$ and $X_{11}$, $X_3$ and $X_{10}$, and $X_4$ and $X_9$ are not respectively the same simultaneously.

$Ar_1$ may advantageously be selected so as not to deteriorate the fluorescent property of a polymer fluorescent body, and specific examples thereof include those satisfying conditions such as the relation of $Ar_2$ and $Ar_4$ in the above-described formula (2) and the like, among groups shown in the following chemical formulae 6 and 7 and those satisfying the relation of $X_1$ and $X_9$, $X_2$ and $X_{10}$, $X_3$ and $X_{11}$, and $X_4$ and $X_{12}$ and the relation of $X_1$ and $X_{12}$, $X_2$ and $X_{11}$, $X_3$ and $X_{10}$, and $X_4$ and $X_9$ in the above-described formula (5), and among groups shown in the following chemical formula 7. Wherein, when $R_9$ in the chemical formula 7 corresponds to $R_7$ in the above-described formula (5), at least one is a group other than a hydrogen atom.

(chemical formulae 6)

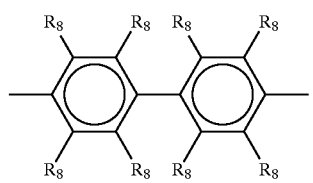

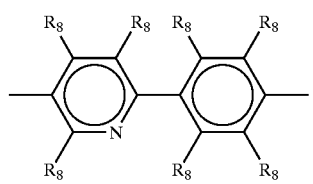

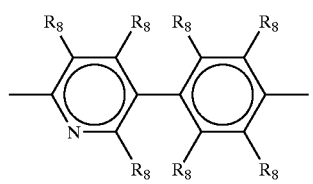

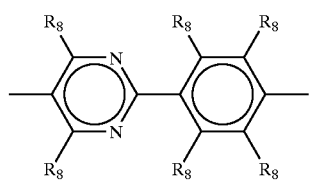

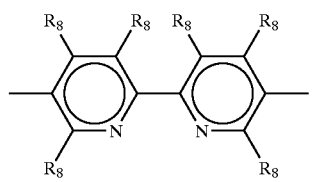

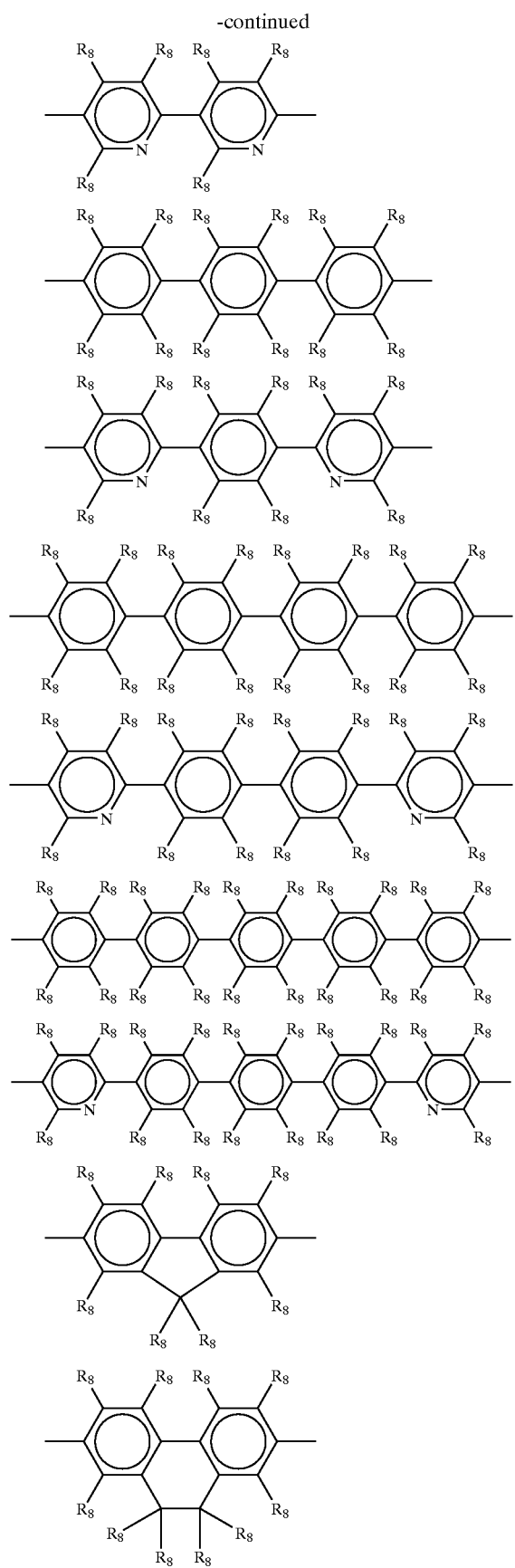
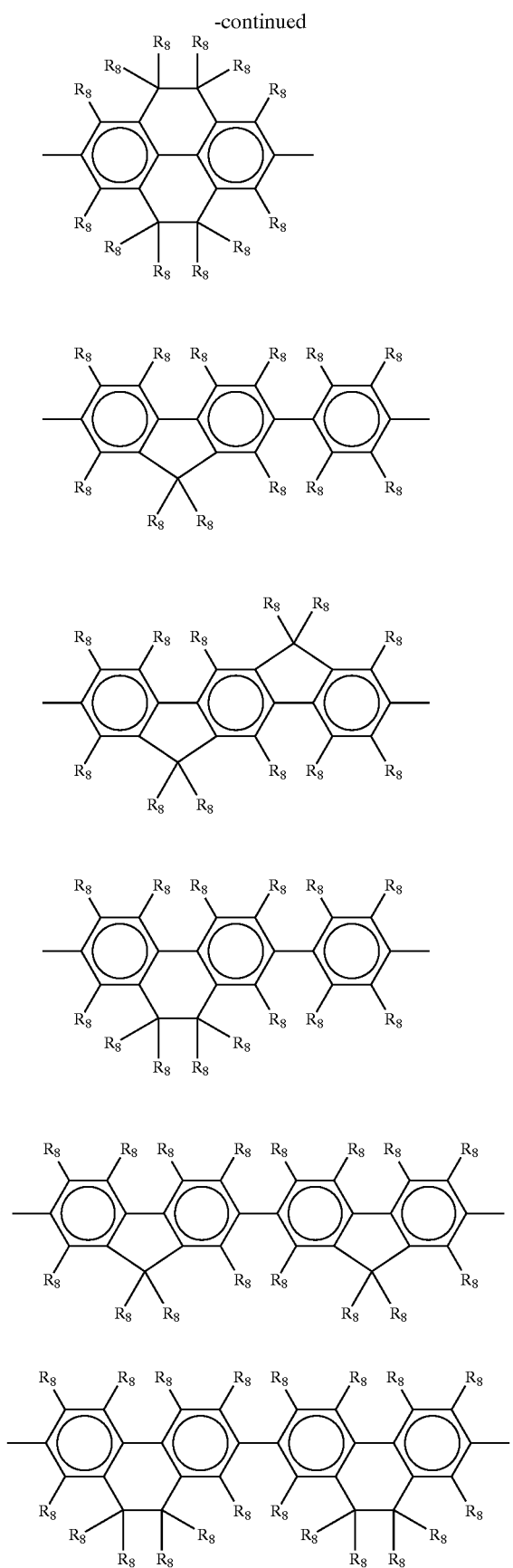

-continued (chemical formulae 7)

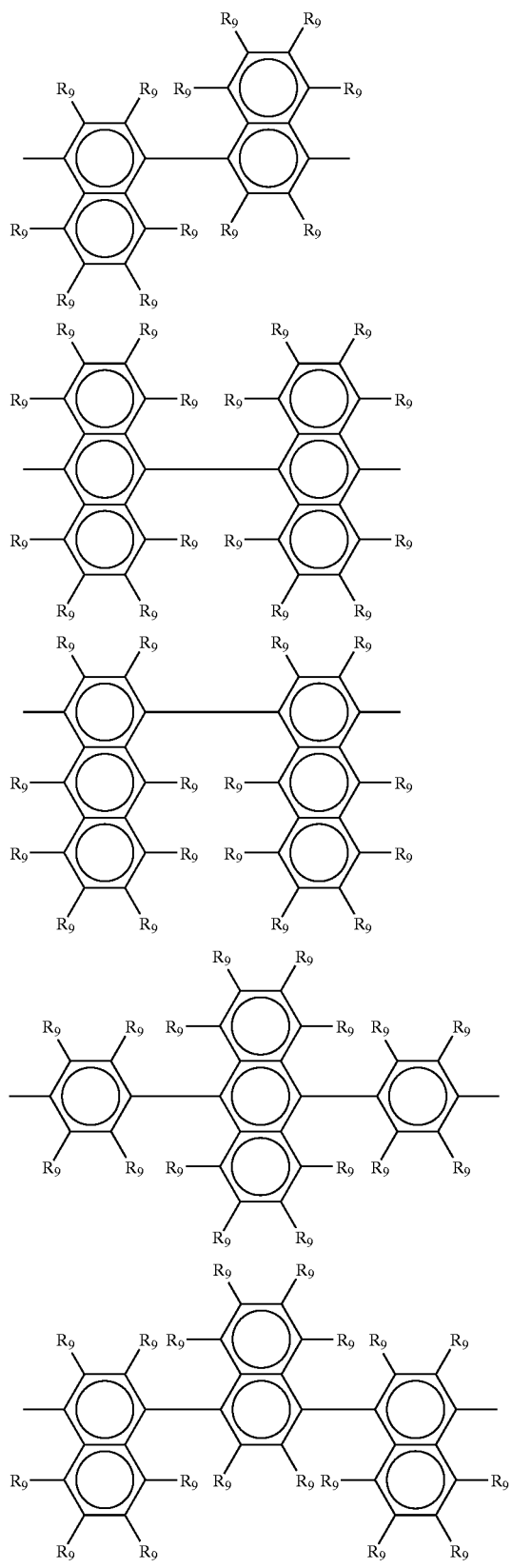

Wherein, $R_8$ and $R_9$ each independently represents a hydrogen atom or a substituent. Examples of the substituent include alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino group having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylalkenyl groups having 8 to 60 carbon atoms, arylalkynyl groups having 8 to 60 carbon atoms, arylamino groups having 6 to 60 carbon atoms, heterocyclic compound groups having 4 to 60 carbon atoms and cyano group. In the above-mentioned examples, a plurality of $R_8$'s or $R_9$'s are present in one structural formula, and they may be the same or different, and they are selected independently from each other.

Regarding substituents other than a hydrogen atom of $Ar_1$, there are listed, for example, those shown in the following chemical formula 8. In the chemical formula 8, $R_{10}$ represents a group other than a hydrogen atom among those exemplified for $R_8$ or $R_9$.

(chemical formulae 8)

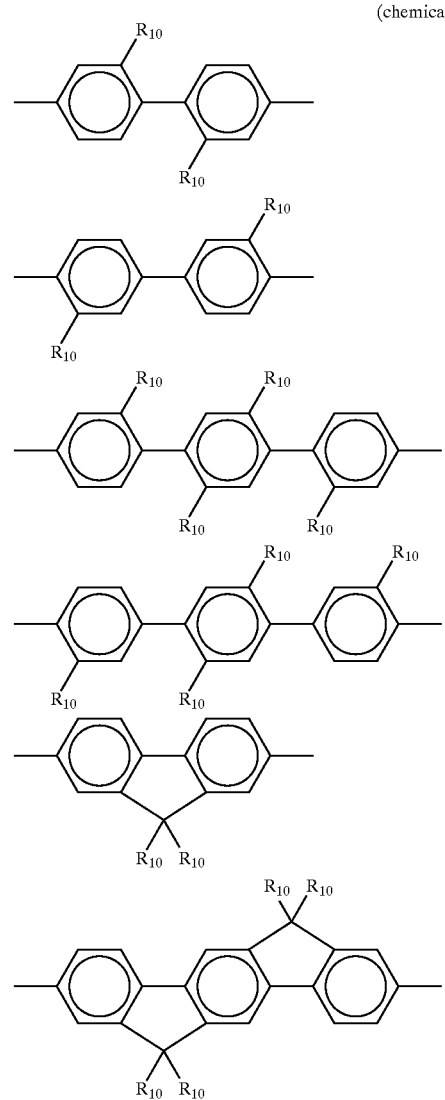

-continued

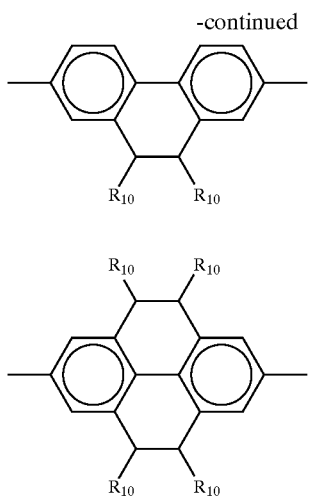

Regarding Ar₁, those in which m is 0 or 1 are preferable, and those in which m is 0 are further preferable. Those obtained by connecting 2 or 3 6-membered rings and condensed rings are preferable, and among those in which m is 0, a substituted biphenylene group, substituted dinaphthalene group, substituted dianthracene group, substituted 9,10-dihydrophenanethrene group, substituted pyrimidinediylphenylene group, and substituted fluorine are further preferable. Among those in which m is 1, a substituted terphenylene group and substituted diphenylanthracene group are further preferable.

Among them, a substituted biphenylene group and substituted fluorene group are particularly preferable.

Ar₅ in the above-described formula (3) and Ar₆ in the above-described formula (4) are an arylene group having 6 to 60 carbon atoms contained in the main chain, or a divalent heterocyclic compound group having 4 to 60 carbon atoms contained in the main chain.

When Ar₅ or Ar₆ has a plurality of substituents, they may be the same or different. For enhancing the solubility into a solvent, it is preferable that at least one substituent other than a hydrogen atom is carried, and it is preferable that the symmetric property of the form of a repeating unit including a substituent is low.

Ar₅ or Ar₆ may be advantageously selected so as not to deteriorate the fluorescent property of a polymeric fluorescent substance, and specific examples thereof include those divalent groups exemplified in the following chemical formulae 9, 10, 11 and 12.

(chemical formulae 9)

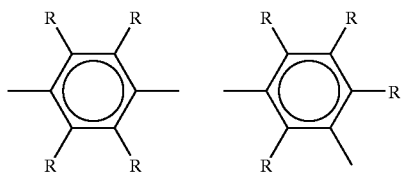

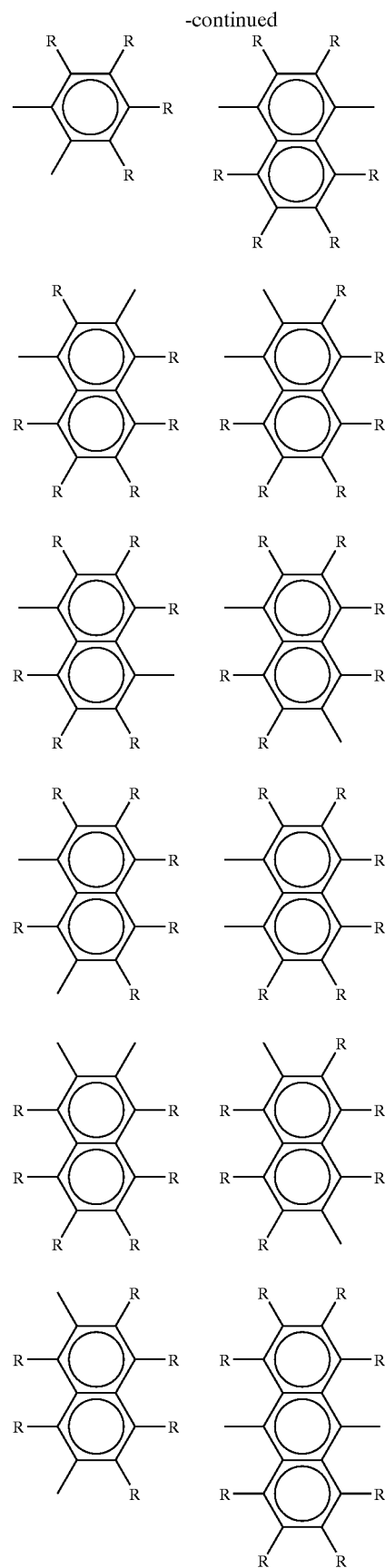

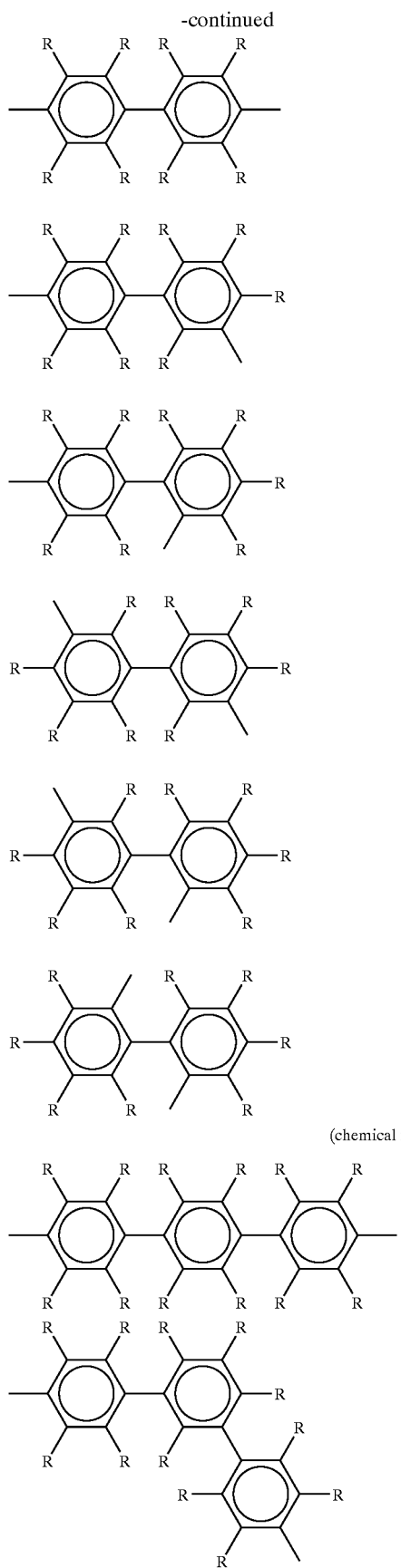
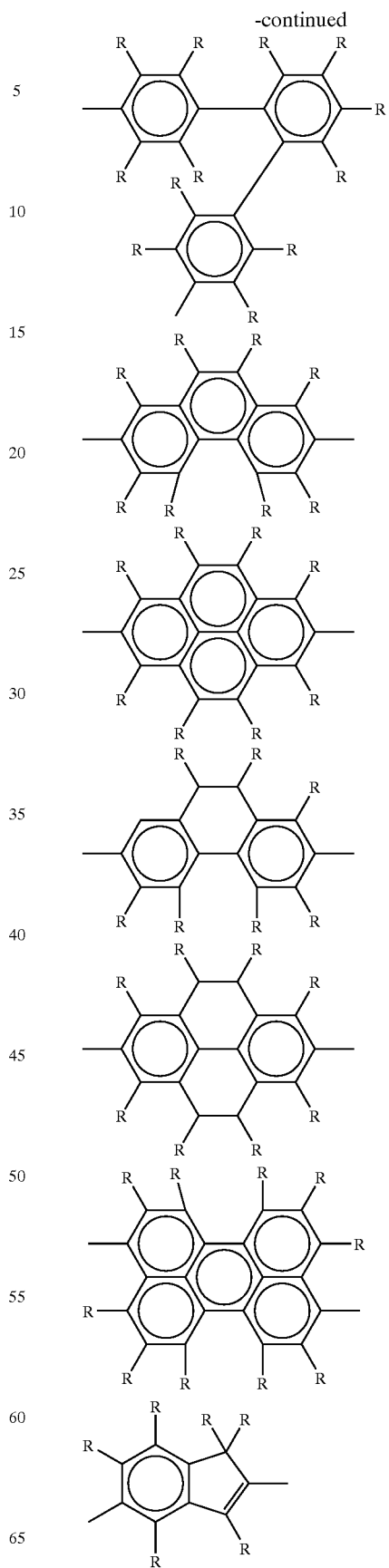

-continued
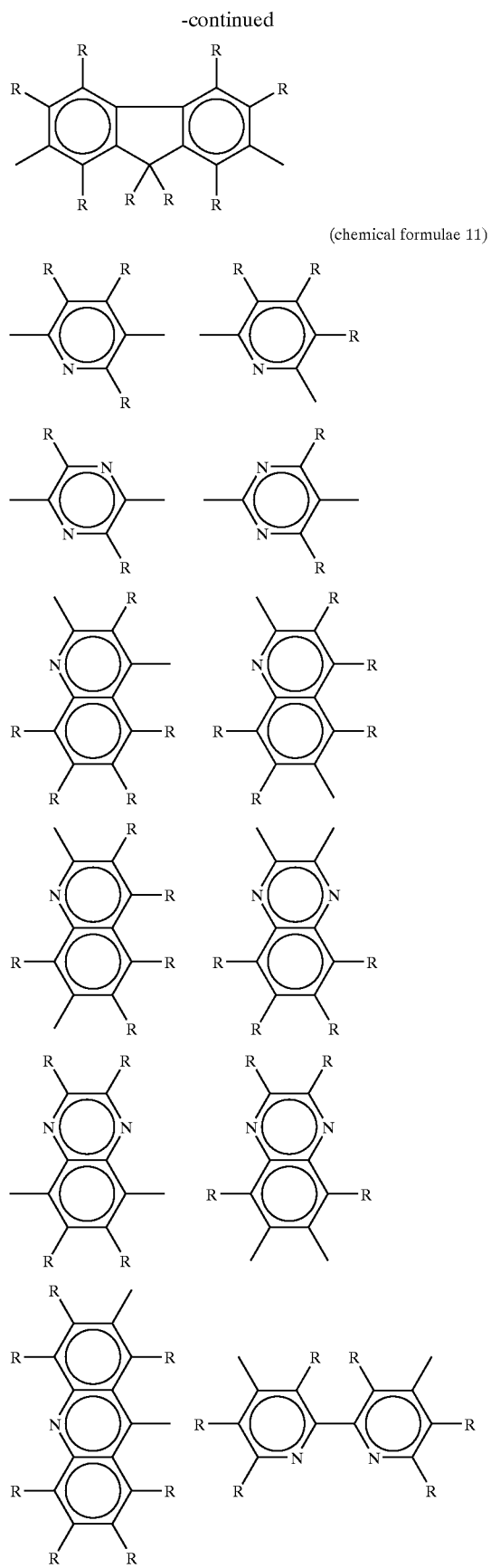
(chemical formulae 11)
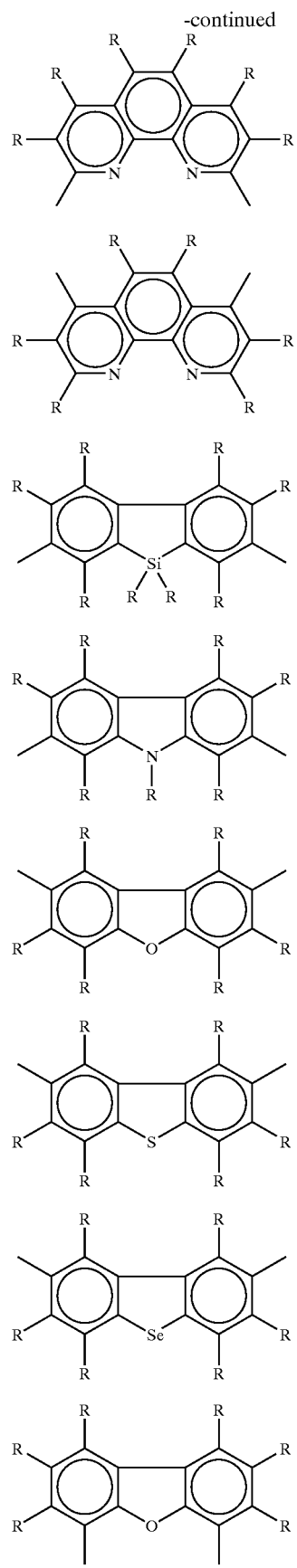

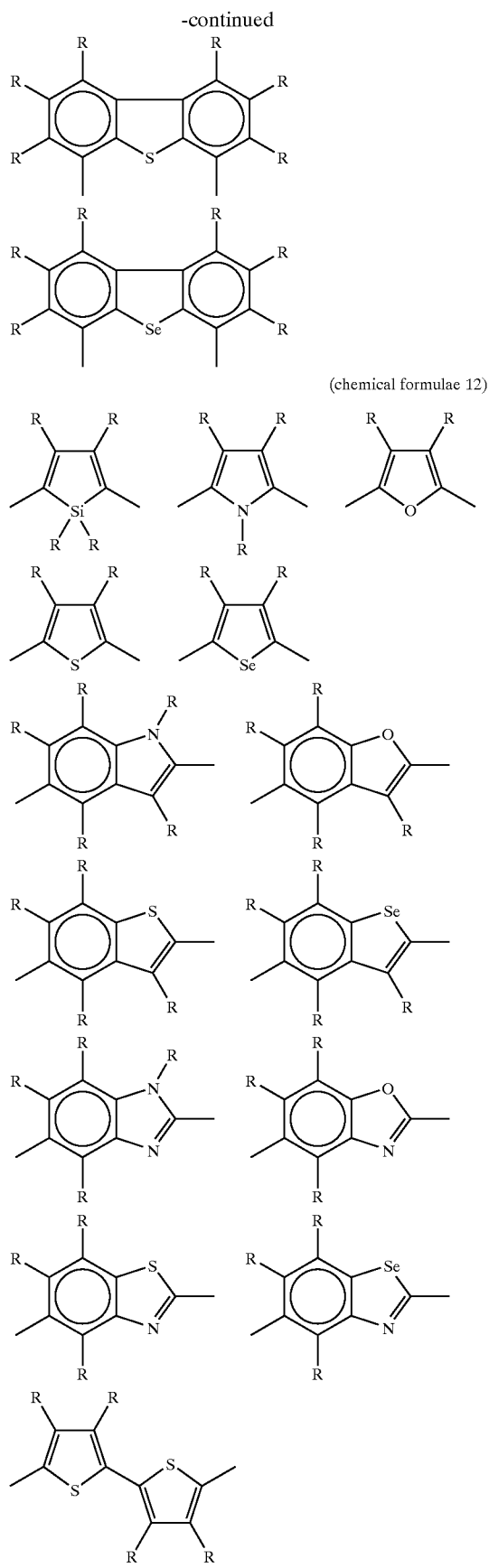

(chemical formulae 12)

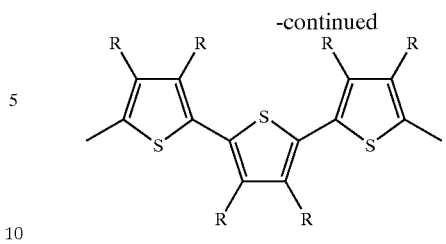

Wherein, R independently represents a hydrogen atom or a substituent. Examples of the substituent include alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino group having 1 to 40 carbon atoms, aryl groups having 6 to 60 carbon atoms, aryloxy groups having 6 to 60 carbon atoms, arylalkyl groups having 7 to 60 carbon atoms, arylalkoxy groups having 7 to 60 carbon atoms, arylalkenyl groups having 8 to 60 carbon atoms, arylalkynyl groups having 8 to 60 carbon atoms, arylamino groups having 6 to 60 carbon atoms, heterocyclic compound groups having 4 to 60 carbon atoms and cyano group. In the above-mentioned examples, a plurality of Rs are present in one structural formula, and they may be the same or different, and they are selected independently from each other. When $Ar_2$ or $Ar_3$ has a plurality of substituents, they may be the same or different. For enhancing the solubility into a solvent, it is preferable that at least one substituent other than a hydrogen atom is carried, and it is preferable that the symmetric property of the form of a repeating unit including a substituent is low.

When R represents other than a hydrogen atom and a cyano group, regarding specific substituents, examples of the alkyl groups of 1 to 20 carbon atoms include a methyl group, ethyl group, propyl group, butyl group, pentyl group, hexyl group, heptyl group, octyl group, nonyl group, decyl group, lauryl group and the like, and a pentyl group, hexyl group, octyl group and decyl group are preferable. Included in examples of the alkyl groups of 5 to 20 carbon atoms are a pentyl group, hexyl group, heptyl group, octyl group, nonyl group, decyl group, lauryl group and the like, and a pentyl group, hexyl group, octyl group and decyl group are preferable.

Given as examples of the alkoxy groups of 1 to 20 carbon atoms are a methoxy group, ethoxy group, propyloxy group, butoxy group, pentyloxy group, hexyloxy group, heptyloxy group, octyloxy group, nonyloxy group, decyloxy group, lauryloxy group and the like and a pentyloxy group, hexyloxy group, octyloxy group and decyloxyl group are preferable. Included in examples of the alkoxy groups of 5 to 20 carbon atoms are a pentyloxy group, hexyloxy group, heptyloxy group, octyloxy group, nonyloxy group, decyloxy group, lauryloxy group and the like, and a pentyloxy group, hexyloxy group, octyloxy group and decyloxy group are preferable.

Examples of the alkylthio groups of 1 to 20 carbon atoms include a methylthio group, ethylthio group, propylthio group, butylthio group, pentylthio group, hexylthio group, heptylthio group, octylthio group, nonylthio group, decylthio group, laurylthio group and the like, and a pentylthio group, hexylthio group, octylthio group and decylthio group are preferable. Included in examples of the alkylthio group of 5 to 20 carbon atoms are a pentylthio group, hexylthio group, heptylthio group, octylthio group, nonylthio group, decylthio group, laurylthio group and the like, and a pentylthio group, hexylthio group, octylthio group and decylthio group are preferable.

Examples of the alkylsilyl group of 1 to 60 carbon atoms include a methylsilyl group, ethylsilyl group, propylsilyl group, butylsilyl group, pentylsilyl group, hexylsilyl group, heptylsilyl group, octylsilyl group, nonylsilyl group, decylsilyl group, laurylsilyl group, trimethylsilyl group, ethyldimethylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and a pentylsilyl group, hexylsilyl group, octylsilyl group, decylsilyl group, pentyldimethylsilyl group, hexyldimethylsilyl group, octyldimethylsilyl group and decyldimethylsilyl group are preferable. Given as examples of the alkylsilyl group of 5 to 60 carbon atoms are a triethylsilyl group, tripropylsilyl group, tributylsilyl group, tripentylsilyl group, trihexylsilyl group, triheptylsilyl group, trioctylsilyl group, trinonylsilyl group, tridecylsilyl group, trilaurylsilyl group, propyldimethylsilyl group, butyldimethylsilyl group, pentyldimethylsilyl group, hexyldimethylsilyl group, heptyldimethylsilyl group, octyldimethylsilyl group, nonyldimethylsilyl group, decyldimethylsilyl group, lauryldimethylsilyl group and the like, and a tripentylsilyl group, trihexylsilyl group, trioctylsilyl group, tridecylsilyl group, pentyldimethylsilyl group, hexyldimethylsilyl group, octyldimethylsilyl group and decyldimethylsilyl group are preferable.

Examples of the alkylamino groups of 1 to 40 carbon atoms include a methylamino group, dimethylamino group, ethylamino group, propylamino group, butylamino group, pentylamino group, hexylamino group, heptylamino group, octylamino group, nonylamino group, decylamino group, laurylamino group and the like, and a pentylamino group, hexylamino group, octylamino group and decylamino group are preferable. Included in examples of the alkylamino groups of 5 to 40 carbon atoms are a pentylamino group, hexylamino group, heptylamino group, octylamino group, nonylamino group, decylamino group, laurylamino group, dipropylamino group, dibutylamino group, dipentylamino group, dihexylamino group, diheptylamino group, dioctylamino group, dinonylamino group, didecylamino group, dilaurylamino group and the like, and a pentylamino group, hexylamino group, octylamino group, decylamino group, dipentylamino group, dihexylamino group, dioctylamino group and didecylamino group are preferable.

Examples of the aryl groups of 6 to 60 carbon atoms include a phenyl group, $C_1$ to $C_{12}$ alkoxyphenyl groups ($C_1$ to $C_{12}$ indicates 1 to 12 carbon atoms: hereinafter the same), $C_1$ to $C_{12}$ alkylphenyl groups, 1-naphthyl group, 2-naphthyl group and the like, and $C_1$ to $C_{12}$ alkoxyphenyl groups and $C_1$ to $C_{12}$ alkylphenyl groups are preferable.

Examples of the aryloxy groups of 6 to 60 carbon atoms include a phenoxy group, $C_1$ to $C_{12}$ alkoxyphenoxy groups, $C_1$ to $C_{12}$ alkylphenoxy groups, 1-naphthyloxy group, 2-naphthyloxy group and the like, and $C_1$ to $C_{12}$ alkoxyphenoxy groups and $C_1$ to $C_{12}$ alkylphenoxy groups are preferable.

Examples of the arylalkyl groups of 7 to 60 carbon atoms include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like, and $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups are preferable. More specific examples thereof include a phenylmethyl group, phenylethyl group, phenylpropyl group, $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group, $C_1$ to $C_{12}$ alkylphenylpropyl group, naphthylmethyl group, naphthylethyl group, naphthylpropyl group and the like, and $C_1$ to $C_{12}$ alkoxyphenylmethyl group, $C_1$ to $C_{12}$ alkoxyphenylethyl group, $C_1$ to $C_{12}$ alkoxyphenylpropyl group, $C_1$ to $C_{12}$ alkylphenylmethyl group, $C_1$ to $C_{12}$ alkylphenylethyl group and $C_1$ to $C_{12}$ alkylphenylpropyl group are preferable.

Examples of the arylalkoxy groups of 7 to 60 carbon atoms include phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like, and $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups are preferable. More specific examples thereof include a phenylmethoxy group, phenylethoxy group, phenylpropyloxy group, $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group, $C_1$ to $C_{12}$ alkylphenylpropyloxy group, naphthylmethoxy group, naphthylethoxy group, naphthylpropyloxy group and the like, and $C_1$ to $C_{12}$ alkoxyphenylmethoxy group, $C_1$ to $C_{12}$ alkoxyphenylethoxy group, $C_1$ to $C_{12}$ alkoxyphenylpropyloxy group, $C_1$ to $C_{12}$ alkylphenylmethoxy group, $C_1$ to $C_{12}$ alkylphenylethoxy group and $C_1$ to $C_{12}$ alkylphenylpropyloxy group are preferable.

Examples of the arylalkenyl groups of 6 to 60 carbon atoms include a phenylethenyl group, $C_1$ to $C_{12}$ alkoxyphenylethenyl groups, $C_1$ to $C_{12}$ alkylphenylethenyl groups, naphthylethenyl group, anthrylethenyl group, pyrenylethenyl group and the like, and $C_1$ to $C_{12}$ alkoxyphenylethenyl groups and $C_1$ to $C_{12}$ alkylphenylethenyl groups are preferable.

Examples of the arylalkynyl groups of 6 to 60 carbon atoms include a phenylethynyl group, $C_1$ to $C_{12}$ alkoxyphenylethynyl groups, $C_1$ to $C_{12}$ alkylphenylethynyl groups, naphthylethynyl group, anthrylethynyl group, pyrenylethynyl group and the like, and $C_1$ to $C_{12}$ alkoxyphenylethynyl groups and $C_1$ to $C_{12}$ alkylphenylethynyl groups are preferable.

Examples of the arylamino groups of 7 to 60 carbon atoms include a phenylamino group, diphenylamino group, $C_1$ to $C_{12}$ alkoxyphenylamino groups, bis($C_1$ to $C_{12}$ alkoxyphenyl)amino groups, bis($C_1$ to $C_{12}$ alkylphenyl)amino groups, 1-naphthylamino group, 2-naphthylamino group and the like, and $C_1$ to $C_{12}$ alkoxyphenylamino groups and bis($C_1$ to $C_{12}$ alkoxyphenyl)amino groups are preferable.

Examples of the heterocyclic compound groups of 4 to 60 carbon atoms include a thienyl group, $C_1$ to $C_{12}$ alkylthienyl groups, pyrrolyl group, furyl group, pyridyl group, $C_1$ to $C_{12}$ alkylpyridyl groups and the like, and a thienyl group, $C_1$ to $C_{12}$ alkylthienyl groups, pyridyl group and $C_1$ to $C_{12}$ alkylpyridyl groups are preferable.

Regarding substituents containing an alkyl group among examples of R, they may be any or linear, branched or cyclic or combination thereof, and when not linear, there are exemplified an isoamyl group, 2-ethylhexyl group, 3,7-dimethyloctyl group, cyclohexyl group, 4-$C_1$ to $C_{12}$ alkylcyclohexyl group and the like. For enhancing the solubility of a polymeric fluorescent substance into a solvent, it is preferable that a cyclic or branched alkyl chain is contained in one or more substituents of $Ar_1$, $Ar_2$ or $Ar_3$.

In the above-described formula (1), n is 0 or 1, in the above-described formula (3), 1 is 0 or 1, and in the above-described formula (4), k is 0 or 1. $R_1$ and $R_2$ in the above-described formula (1), $R_3$ and $R_4$ in the above-described formula (3) and $R_5$ and $R_6$ in the above-described formula (4) each independently represents a group selected from the group consisting of a hydrogen atom, alkyl group having 1 to 20 carbon atoms, aryl group having 6 to 60 carbon atoms, heterocyclic compound having 4 to 60 carbon atoms and cyano group. When $R_1$, $R_2$, $R_3$, $R_4$, $R_5$ and $R_6$ represent a substituent other than a hydrogen atom or cyano group, examples of the alkyl group having 1 to 20 carbon atoms include a methyl group, ethyl group, propyl group, butyl group, pentyl group, hexyl group, heptyl group, octyl group, nonyl group, decyl group, lauryl group and the like, and a methyl group, ethyl group, pentyl group, hexyl group, heptyl group and octyl group are preferable.

Examples of the aryl group having 6 to 60 carbon atoms include a phenyl group, $C_1$ to $C_{12}$ alkoxyphenyl group, $C_1$ to $C_{12}$ alkylphenyl group, 1-naphthyl group, 2-naphthyl group and the like, and a phenyl group and $C_1$ to $C_{12}$ alkylphenyl group are preferable.

Examples of the heterocyclic compound group having 4 to 60 carbon atoms include a thienyl group, $C_1$ to $C_{12}$ alkylthienyl group, pyrrolyl group, furyl group, pyridyl group, $C_1$ to $C_{12}$ alkylpyridyl group and the like, and a thienyl group, $C_1$ to $C_{12}$ alkylthienyl group, pyridyl group and $C_1$ to $C_{12}$ alkylpyridyl group are preferable.

The terminal group of a polymeric fluorescent substance is not particularly restricted, and since if a active polymerizable group remains intact, light emitting property and life when the material is used in an device, may possibly decrease, the terminal group may also be protected or replaced with a stable group. Those having a conjugated bond continued to the conjugated structure of the main chain are preferable, and there are exemplified structures containing a bond to an aryl group or a heterocyclic compound group via a vinylene group. Specifically, substituents described in JP-A No. 9-45478, chemical formula 10, and the like are exemplified.

For synthesizing this polymeric fluorescent substance, when the main chain has vinylene groups, there are exemplified methods described in JP-A No. 5-202355. Namely, there are exemplified polymerization of dialdehyde compounds with diphosphonium salt compounds or of compounds having both of aldehyde and phosphonium salt groups, or polymerization of dialdehyde compounds with a bisphosphate ester compound or of compounds having both of aldehyde and phosphate ester groups, by the Wittig reaction, polymerization of divinyl compounds with dihalogen compounds or of vinylhalogen compounds alone by the Heck reaction, polycondensation of compounds having two methyl halide groups by a dehydrohalogenation method, polycondensation of compounds having two sulfonium salt groups by a sulfonium salt decomposing method, polymerization of dialdehyde compounds with diacetonitrile compounds or of compounds having both of aldehyde and acetonitrile groups by the Knoevenagel reaction, polymerization of dialdehyde compounds by the McMurry reaction, polymerization of compounds having both of aromatic shiff base and methyl groups by the Siegrist reaction, and the like.

Further, when the main chain does not have a vinylene group, there are exemplified a method in which polymerization is conducted from the corresponding monomer by the Suzuki coupling reaction, a method in which polymerization is conducted by the Grignard reaction, a method in which polymerization is conducted using a Ni(O) catalyst, a method in which polymerization is conducted using an oxidizing agent such as $FeCl_3$ and the like, a method in which oxidation polymerization is conducted electrochemically, a method in which an intermediate polymer having a suitable releasing group is decomposed, and the like.

This polymeric fluorescent substance may contain other repeating unit than the repeating unit of the formulae (1), (3) or (4) in the range wherein luminescent property and charge transport property do not deteriorate. The repeating unit of the formulae (1), (3), (4) or other unit than the repeating unit of the formulae (1), (3) or (4) may be connected via a non-conjugated unit, or such non-conjugated part may also be contained in the repeating unit. As the linkage structure, there are exemplified those shown in the following chemical formula 13, combinations of those shown in the following chemical formula 13 with a vinylene group, combinations of two or more of those shown in the following chemical formula 13, and the like. Herein, R's each independently represents a group selected from the group consisting of a hydrogen atom, alkyl groups of 1 to 20 carbon atoms, aryl groups of 6 to 60 carbon atoms, heterocyclic compound groups of 4 to 60 carbon atoms and a cyano group, and Ar represents a hydrocarbon group of 6 to 60 carbon atoms. Specific examples of these groups are the same as those exemplified above.

(chemical formulae 13)

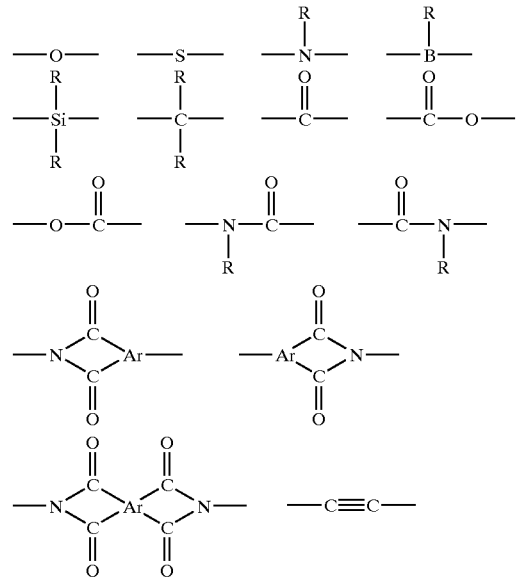

This polymeric fluorescent substance may also be a random, block or graft copolymer, or a polymer having an intermediate structure thereof, for example, a random copolymer having blocking property. From the viewpoint f or obtaining a polymeric fluorescent substance having high fluorescent quantum yield, random copolymers having blocking property and block or graft copolymers are more preferable than complete random copolymers. Dendrimers or copolymers having branching in the main chain and having three or more terminals are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $10^3$ to $10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising a pair of electrodes composed of an anode and a cathode at least one of which is transparent or semitransparent and a light emitting layer-disposed between the electrodes, and a polymeric fluorescent substance of the present invention is contained in the light emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.
  a) anode/light emitting layer/cathode
  b) anode/hole transporting layer/light emitting layer/cathode
  c) anode/light emitting layer/electron transporting layer/cathode
  d) anode/hole transporting layer/light emitting layer/electron transporting layer/cathode (wherein, / indicates adjacent lamination of layers. Hereinafter, the same).

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each be independently used in two or more layers.

Of charge transporting layers disposed adjacent to an electrode, that having function to improve charge injecting efficiency from the electrode and having effect to decrease driving voltage of a device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.
  e) anode/charge injecting layer/light emitting layer/cathode
  f) anode/light emitting layer/charge injecting layer/cathode
  g) anode/charge injecting layer/light emitting layer/charge injecting layer/cathode
  h) anode/charge injecting layer/hole transporting layer/light emitting layer/cathode
  i) anode/hole transporting layer/light emitting layer/charge injecting layer/cathode
  j) anode/charge injecting layer/hole transporting layer/light emitting layer/charge injecting layer/cathode
  k) anode/charge injecting layer/light emitting layer/electron transporting layer/cathode
  l) anode/light emitting layer/electron transporting layer/charge injecting layer/cathode
  m) anode/charge injecting layer/light emitting layer/electron transporting layer/charge injecting layer/cathode
  n) anode/charge injecting layer/hole transporting layer/light emitting layer/electron transporting layer/cathode
  o) anode/hole transporting layer/light emitting layer/electron transporting layer/charge injecting layer/cathode
  p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing a conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode.

In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 $\mu$m, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

A polymer binder to be mixed is preferably used which does not extremely disturb the charge transport property, and which does not have strong absorption of visible light. As such polymer binders, polycarbonate, polyacrylate, poly (methyl acrylate) poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 $\mu$m, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(Nvinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 $\mu$m, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium tin oxide (ITO), indium·zinc·oxide and the like, which are metal oxide complexes, and gold, platinum, silver, copper and the like are used, and among them, ITO, indium·zinc·oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 $\mu$L m, preferably from 20 nm to 1 $\mu$m, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 $\mu$m, preferably from 20 nm to 1 $\mu$m, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a number average molecular weight in terms of polystyrene was measured by gel permeation chromatography (GPC) using chloroform as a solvent.

Example 1

<Synthesis of Polymeric Fluorescent Substance 1>

4,4'-bischloromethyl-2,2'-bis(3,7-dimethyloctyloxy)-1,1'-biphenylene (0.98 g) and 2-methoxy-5-(2-ethylhexyloxy)-p-xylene dichloride (0.12 g) (molar ratio, 98:2) were dissolved in 200 g of 1,4-dioxane, and deaerated by bubbling of nitrogen for 30 minutes, then, the reaction solution was heated up to 95° C. To this solution was added a solution of t-butoxypotassium (0.55 g)/dry 1,4-dioxane (15 g) dropwise over a period of 5 minutes. Further, this solution was heated to 97° C., then, a solution of t-butoxypotassium (0.42 g)/dry 1,4-dioxane (12 g) was added dropwise. They were allowed to react for 2 hours at 98° C. After the reaction, the mixture was cooled to 50%, and a mixed solution of acetic acid/1,4-dioxane was added for neutralization. After allowing to cool to room temperature, this reaction solution was poured into a stirred ion exchange water. Then, the deposited precipitate was filtrated, and washed with methanol. This was dried under reduced pressure to obtain a polymer.

Then, this was dissolved in tetrahydrofuran, and the resulting solution was poured into methanol, and purified by precipitation again. This precipitate was washed with ethanol, then, dried under reduced pressure to obtain 0.01 g of a polymeric fluorescent substance.

This polymeric fluorescent substance 1 had a number-average molecular weight of $3.2 \times 10^4$ and a weight-average molecular weight of $8.8 \times 10^4$, in terms of polystyrene. Regarding the structure of this polymeric fluorescent substance 1, a spectrum corresponding to that of a copolymer of 2,2'-bis(3,7-dimethyloctyloxy)-4,4-biphenylenevinylene and 2-methoxy-5-(2-ethylhexyloxy)-p-phenylenevinylene was obtained by $^1$H-NMR. The structural formulae of repeating units of the polymeric fluorescent substance 1 are shown below.

(chemical formulae 14)

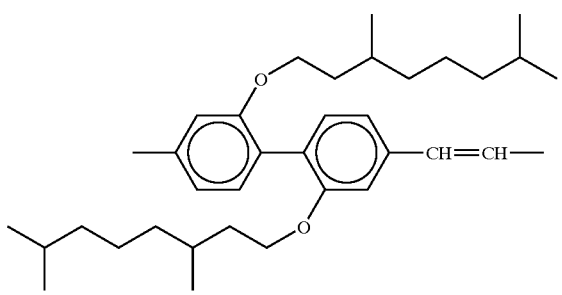

(chemical formulae 15)

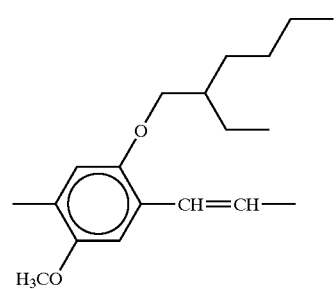

<Measurement of Absorption Spectral, Fluorescent Spectral>

The above-mentioned polymeric fluorescent substance 1 and polymeric fluorescent substances 2 to 3 produced in the following Reference Examples 1 to 2 could be dissolved in chloroform. The resulted 0.2% chloroform solution was spin-coated on a quartz plate to form a thin film of a polymer. The ultraviolet visible absorption spectral and fluorescent spectral of this thin film were measured by using a self-recording spectrophotometer UV365 (manufactured by Shimadzu Corp.) and a fluorescent spectrophotometer 850 (manufactured by Hitachi, Ltd.), respectively. The absorption edge wavelength was obtained from the absorption spectral. The fluorescent peak wavelength was obtained from the fluorescent spectral excited at 330 nm or 410 nm. As shown in Table 1, the polymeric fluorescent substance 1 of Example 1 had a fluorescent spectral different from any of polymeric fluorescent substances 2 to 3 of Reference Examples 1 to 2.

When the absorption edge wavelengths of the polymeric fluorescent substances 2 and 3 are represented by $\lambda_{p2}$ and $\lambda_{p3}$ respectively, the following relation was satisfied:

$$1239/\lambda_{p2} \geq 1239/\lambda_{p3} + 0.05.$$

Namely, the relation of (c) in claim 1 could be confirmed in the polymeric fluorescent substance 1.

Reference Example 1

<Synthesis of Polymeric Fluorescent Substance 2>

4,4'-bischloromethyl-2,2'-bis(3,7-dimethyloctyloxy)-1,1'-biphenylene (1.0 g) was dissolved in 200 g of 1,4-dioxane, and deaerated by bubbling of nitrogen for 30 minutes, then, the reaction solution was heated up to 95° C. To this solution was added a solution of t-butoxypotassium (0.55 g)/dry 1,4-dioxane (15 g) dropwise over a period of 5 minutes. Further, this solution was heated to 97° C., then, a solution of t-butoxypotassium (0.42 g)/dry 1,4-dioxane (12 g) was added dropwise. They were allowed to react for 2 hours at 98%. After the reaction, the mixture was cooled to 50%, and a mixed solution of acetic acid/1,4-dioxane was added for neutralization. After allowing to cool to room temperature, this reaction solution was poured into a stirred ion exchange water. Then, the deposited precipitate was filtrated, and washed with methanol. This was dried under reduced pressure to obtain a polymer.

Then, this was dissolved in tetrahydrofuran, and the resulting solution was poured into methanol, and purified by precipitation again. This precipitate was washed with ethanol, then, dried under reduced pressure to obtain 0.02 g of a polymeric fluorescent substance.

This polymeric fluorescent substance 2 had a number-average molecular weight of $3.3 \times 10^4$ in terms of polystyrene. Regarding the structure of this polymeric fluorescent substance 2, a spectral corresponding to that of poly{2,2'-bis(3,7-dimethyloctyloxy)-4,4'-biphenylenevinylene} was obtained by $^1$H-NMR.

The structural formula of the repeating unit of the polymeric fluorescent substance 2 is shown below.

(chemical formulae 16)

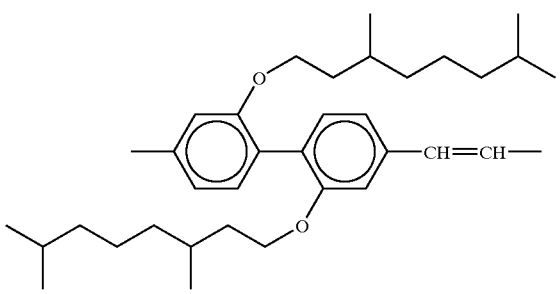

Reference Example 2

<Synthesis of Polymeric Fluorescent Substance 3>

2-methoxy-5-(2-ethylhexyloxy)-p-xylene dichloride (3.32 g) was dissolved in 300 g of dry tetrahydrofuran, and deaerated by bubbling of nitrogen for 15 minutes, then, a solution of t-butoxypotassium (6.72 g) dissolved in dry tetrahydrofuran (30 g) was added dropwise at room temperature. Subsequently, this solution was allowed to react for 7 hours at room temperature. Then, this reaction solution was poured into methanol containing 3.5 ml of glacial acetic acid, and the produced red precipitate was recovered by filtration.

Then, this precipitate was washed with ethanol, then, washed with an ethanol/ion exchange water mixed solvent repeatedly, and finally, washed with ethanol. This was dried under reduced pressure to obtain 1.3 g of a polymer. Then, this polymer was dissolved in toluene. This polymer solution was poured into methanol, and purified by precipitation again. The precipitate was recovered, then, this was dried under reduced pressure to obtain a polymeric fluorescent substance 3.

This polymeric fluorescent substance 3 had a number-average molecular weight of $9.9 \times 10^4$ in terms of polystyrene. Regarding the structure of this polymeric fluorescent substance 3, a spectral corresponding to that of poly(2-methoxy-5-(2-ethylhexyloxy)-p-phenylenevinylene) was obtained by $^1$H-NMR.

The structural formula of the repeating unit of the polymeric fluorescent substance 3 is shown below.

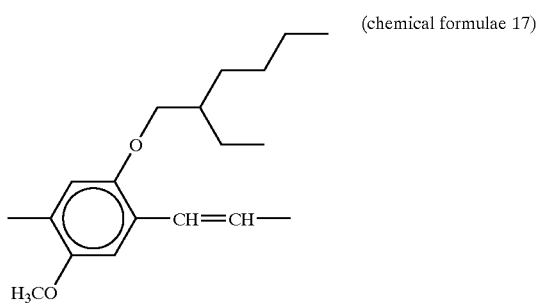

(chemical formulae 17)

TABLE 1

| | Polymeric fluorescent substance | Fluorescence peak (nm) | Excitation wavelength (nm) | Absorption edge wavelength (nm) |
|---|---|---|---|---|
| Example 1 | Polymeric fluorescent substance 1 | *(460) 548 | 330 | 425 |
| Reference example 1 | Polymeric fluorescent substance 2 | 442 | 330 | 425 |
| reference example 2 | Polymeric fluorescent substance 3 | 588 | 410 | 590 |

*: Shoulder is present around 460 nm

Example 2

<Synthesis of Polymeric Fluorescent Substance 4>

9,9-bis(3,7-dimethyloctyl)fluorene-2,7-bisboric acid (0.587 g), 2,7-dibromo-9,9-bis(3,7-dimethyloctyl)fluorene (0.592 g) and 1,4-dibromo-2,5-bis(3,7-dimethyloctyloxy)benzene (0.01 g)(molar ratio, 50:45:5) and 0.23 g of sodium carbonate were charged into a flask under argon atmosphere, and to this was added 2 ml of toluene, 2.5 ml of ethanol and 1.2 ml of ion exchange water. The flask was deaerated with argon for 25 minutes, then, 0.08 g of tetrakis(triphenylphosphine)palladium was added, and further deaerated for 5 minutes. This reaction solution was heated to 90° C., and allowed to react for 12 hours. After allowing to cool to room temperature, the reaction solution was poured into methanol/water. The deposited precipitate was filtrated, and washed with water and methanol in this order.

Then the precipitate was dissolved in tetrahydrofuran, and the solution was poured into methanol, and purified by precipitation again. This precipitate was dried under reduced pressure to obtain 0.59 g of a polymeric fluorescent substance 4.

This polymeric fluorescent substance 4 had a number-average molecular weight of $1.6 \times 10^4$ and a weight-average molecular weight of $4.2 \times 10^4$, in terms of polystyrene. Regarding the structure of this polymeric fluorescent substance 4, a spectral corresponding to that of a copolymer of 9,9-bis(3,7-dimethyloctyl)fluorene-2,7-diyl and 2,5-bis(3,7-dimethyloctyloxy)-1,4-phenylene was obtained by $^1$H-NMR.

The structural formulae of repeating units of the polymeric fluorescent substance 4 are shown below.

(chemical formulae 18)

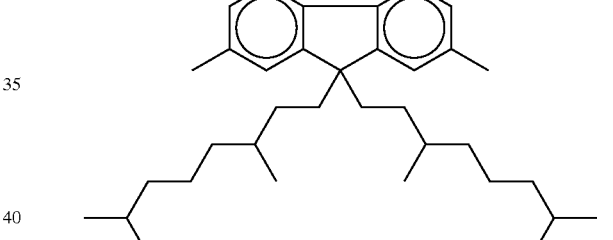

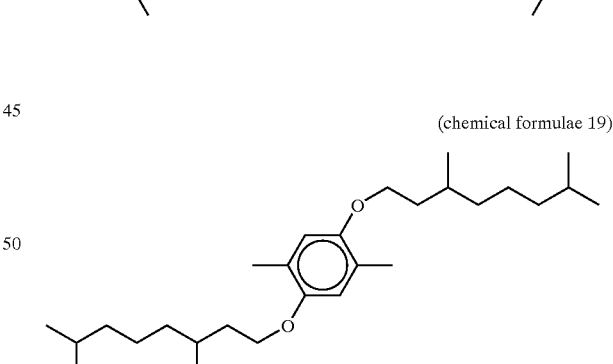

(chemical formulae 19)

The fluorescent spectral and absorption spectral of the polymeric fluorescent substance 4 were measured by the same procedure as in Example 1 to find that the fluorescent peak wavelength was 426 nm and the absorption edge wavelength was 430 nm.

<Fabrication and Evaluation of Element>

Onto a glass substrate carrying an ITO film having a thickness of 150 nm formed by a sputtering method was spin-coated a 1.0 wt % solution of the polymeric fluorescent substance 4 in chloroform, to form a film having a thickness of 120 nm. Further, this was dried for 1 hour at 80 under reduced pressure, then, lithium fluoride was deposited to form an about 0.4 nm thick film, then, calcium was deposited to form a 40 nm thick film, and further, aluminum was deposited to form a 70 nm thick film, as a cathode, obtaining a polymer LED. The degrees of evacuation in the depositions were all $8\times10^{-6}$ Torr or less. When a voltage of 10 V was applied to the resulted element, blue EL emission was observed. The emission spectral of the element had a peak at the same position as in the emission spectral of the polymeric fluorescent substance 4.

Example 4

<Synthesis of Polymeric Fluorescent Substance 5>
2,2'-bis{4-(3,7-dimethyloctyloxy)phenyl}-4,4'-bischloromethylbiphenylene and 2-methoxy-5-(2-ethylhexyloxy)-p-xylene dichloride are charged at a molar ratio of 98:2, and polymerized by a dehydrohalogenation method using t-butoxypotassium. The resulted polymer is called a polymeric fluorescent substance 5.

The polymeric fluorescent substance 5 is a random copolymer of 2,2'-bis{4-(3,7-dimethyloctyloxy)phenyl}-4,4'-biphenylenevinylene and 2-methoxy-5-(2-ethylhexyloxy)-p-xylenevinylene.

The structural formulae of repeating units of the polymeric fluorescent substance 5 are shown below.

(chemical formulae 20)

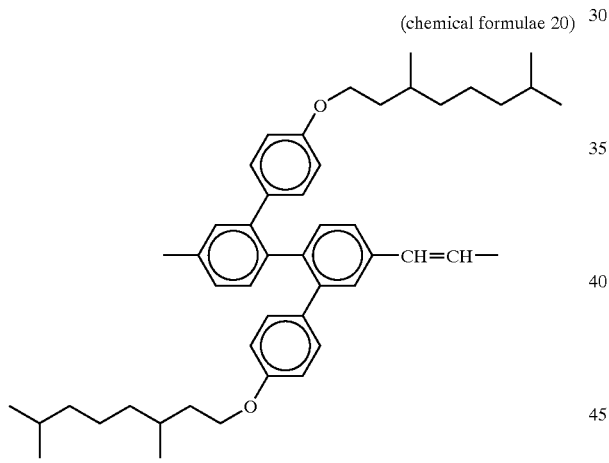

(chemical formulae 21)

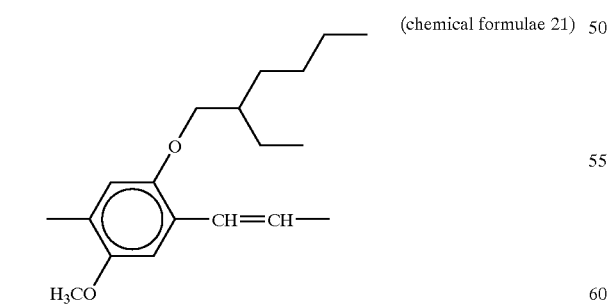

Example 5

<Synthesis of Polymeric Fluorescent Substance 6>
2,7-bis(bromomethyl)-9,9-bis(3,7-dimethyloctyl)fluorene and triphenylphosphine are reacted to obtain a phosphonium salt. This phosphonium salt, 2,7-diformyl-9,9-bis(3,7-dimethyloctyl)fluorene, 2,5-bis(3,7-dimethyloctyloxy) terephthalaldehyde are charged at a molar ratio of 1:0.96:0.04, and polymerized by Wittig reaction. The resulted polymer is called a polymeric fluorescent substance 6.

This polymeric fluorescent substance 6 is a random copolymer of 9,9-bis(3,7-dimethyloctyl)fluorenevinylene and 2,5-bis(3,7-dimethyloctyl)phenylenevinylene.

The structural formulae of repeating units of the polymeric fluorescent substance 6 are shown below.

(chemical formulae 22)

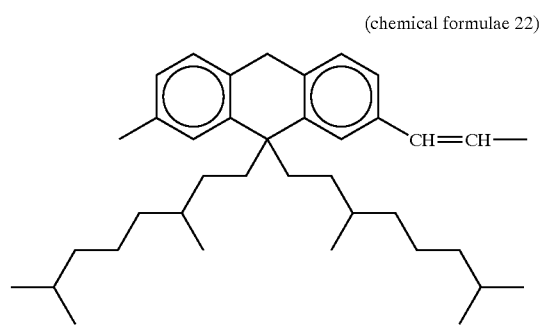

(chemical formulae 23)

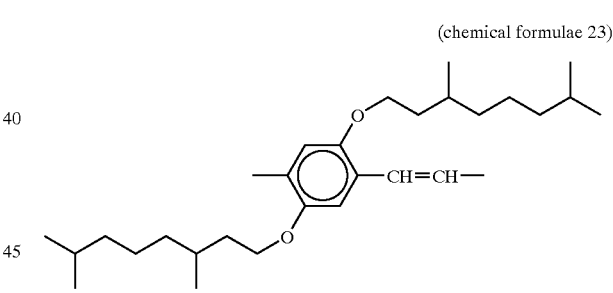

Example 6

<Synthesis of Polymeric Fluorescent Substance 7>
2,2'-bis(3,7-dimethyloctyloxy)-4,4'-bis(bromomethyl)biphenylene and triphenylphosphine are reacted to obtain a phosphonium salt. This phosphonium salt, 2,2'-bis(3,7-dimethyloctyloxy)-4,4'-diformyl-biphenylene, 2,5-bis(3,7-dimethyloctyloxy)terephthalaldehyde are charged at a molar ratio of 1:0.96:0.04, and polymerized by Wittig reaction. The resulted polymer is called a polymeric fluorescent substance 7.

This polymeric fluorescent substance 7 is a random copolymer of 2,2'-bis(3,7-dimethyloctyloxy)biphenylene vinylene and 2,5-bis(3,7-dimethyloctyl)phenylenevinylene.

The structural formulae of repeating units of the polymeric fluorescent substance 7 are shown below.

(chemical formulae 24)

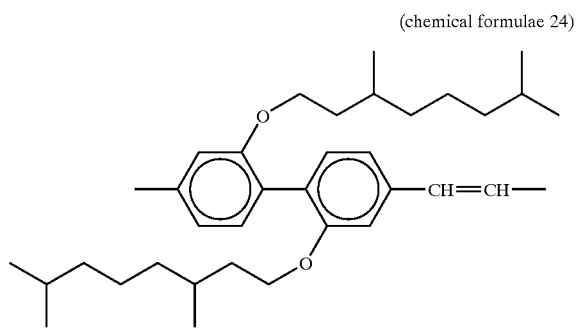

(chemical formulae 25)

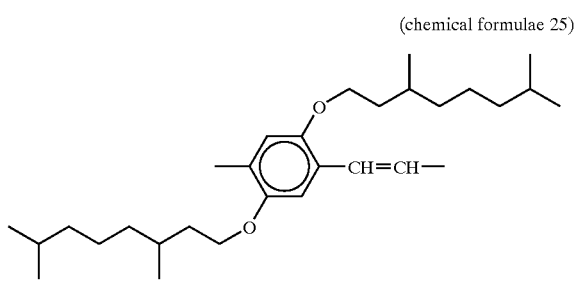

Example 7

<Synthesis of Polymeric Fluorescent Substance 8>
2,2'-bis(4-(3,7-dimethyloctyloxy)phenyl)-4,4'-bis(bromomethyl)biphenylene and triphenylphosphine are reacted to obtain a phosphonium salt. This phosphonium salt, 2,2'-bis(4-(3,7-dimethyloctyloxy)phenyl)-4,4'-diformyl-biphenylene, 2,5-bis(3,7-dimethyloctyloxy)terephthalaldehyde are charged at a molar ratio of 1:0.96:0.04, and polymerized by Wittig reaction. The resulted polymer is called a polymeric fluorescent substance 8.

This polymeric fluorescent substance 8 is a random copolymer of 2,2'-bis(4-(3,7-dimethyloctyloxy)phenyl)-biphenylenevinylene and 2,5-bis(3,7-dimethyloctyl)phenylenevinylene.

The structural formulae of repeating units of the polymeric fluorescent substance 8 are shown below.

(chemical formulae 26)

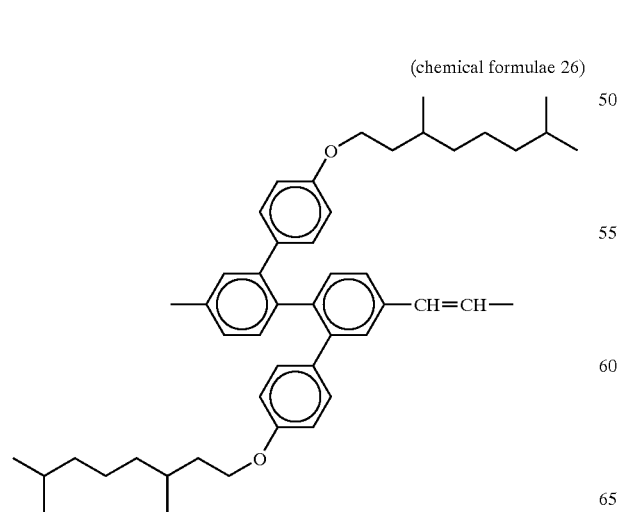

(chemical formulae 27)

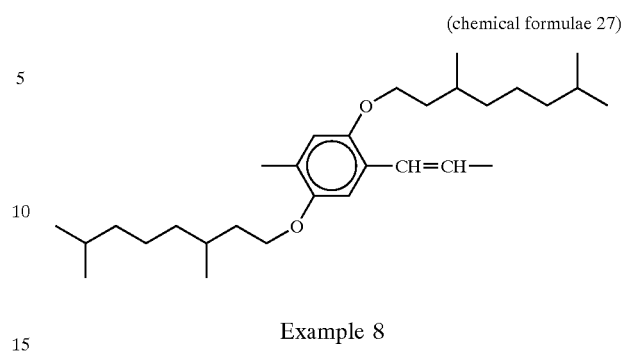

Example 8

<Synthesis of Polymeric Fluorescent Substance 9>
9,10-bis(3,7-dimethyloctyl)-2,7-bis(bromomethyl)-dihydrophenanthrene and triphenylphosphine are reacted to obtain a phosphonium salt. This phosphonium salt, 9,10-bis(3,7-dimethyloctyl)-2,7-diformyl-dihydrophenanthrene, 2,5-bis(3,7-dimethyloctyloxy)terephthalaldehyde are charged at a molar ratio of 1:0.96:0.04, and polymerized by Wittig reaction. The resulted polymer is called a polymeric fluorescent substance 9.

This polymeric fluorescent substance 9 is a random copolymer of 9,10-bis(3,7-dimethyloctyl)dihydrophenanthrenevinylene and 2,5-bis(3,7-dimethyloctyl)phenylenevinylene.

The structural formulae of repeating units of the polymeric fluorescent substance 9 are shown below.

(chemical formulae 28)

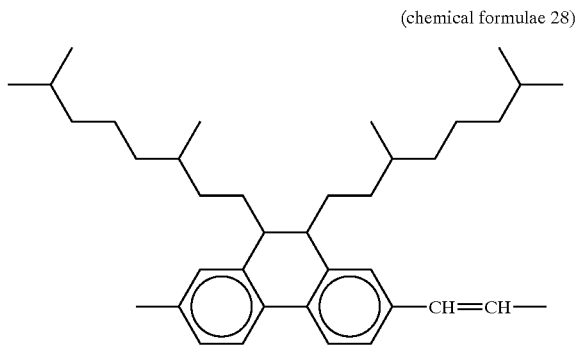

(chemical formulae 29)

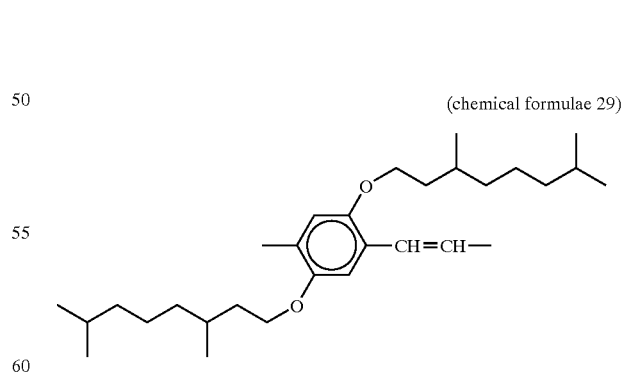

Example 9

<Synthesis of Polymeric Fluorescent Substance 10>
9,10,11,12-tetrakis(3,7-dimethyloctyl)-2,7-bis (bromomethyl) tetrahydropyrene and triphenylphosphine are reacted to obtain a phosphonium salt. This phosphonium salt, 9,10, 11,12-tetrakis(3,7-dimethyloctyl)-2,7-diformyl-tetrahydropyrene, 2,5-bis(3,7-dimethyloctyloxy)terephthalaldehyde are charged at a molar ratio of 1:0.96:0.04, and polymerized by Wittig reaction. The resulted polymer is called a polymeric fluorescent substance 10.

This polymeric fluorescent substance 10 is a random copolymer of 9,10,11,12-tetrakis(3,7 -dimethyloctyl)tetrahydropyrenylenevinylene and 2,5-bis(3,7-dimethyloctyl) phenylenevinylene.

The structural formulae of repeating units of the polymeric fluorescent substance 10 are shown below.

(chemical formulae 30)

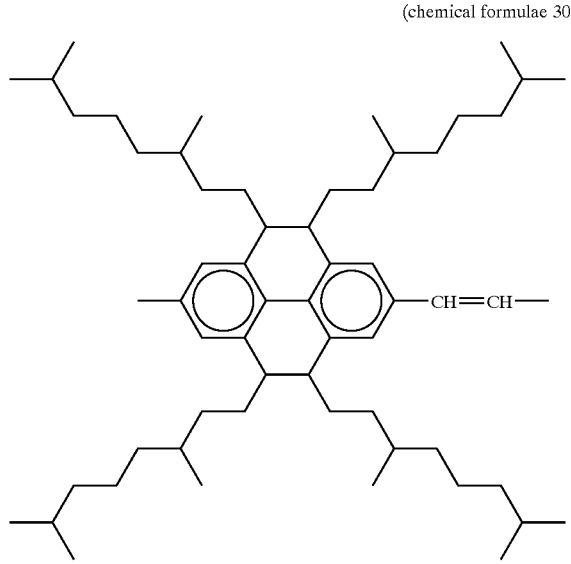

(chemical formulae 31)

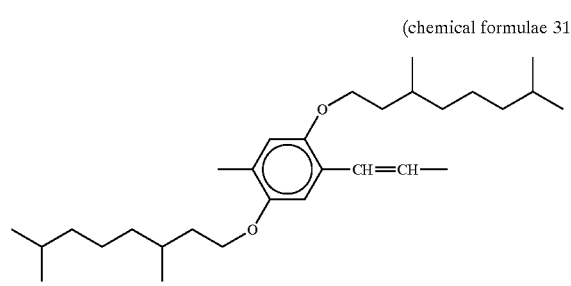

Example 10

<Synthesis of Polymeric Fluorescent Substance 11>

2,2'-bis(3,7-dimethyloctyloxy)biphenylene-4,4'-divinyl, 2,2'-bis(3,7-dimethyloctyloxy)-4,4'-dibromo-bipheneyl and 2,5-bis(3,7-dimethyloctyloxy)-1,4 -dibromobenzene are charged at a molar ratio of 1:0.96:0.04, and polymerized by Heck reaction. The resulted polymer is called a polymeric fluorescent substance 11.

This polymeric fluorescent substance 11 is a random copolymer of 2,2'-bis(3,7-dimethyloctyloxy)biphenylenevinylene and 2,5-bis(3,7-dimethyloctyl)phenylenevinylene.

The structural formulae of repeating units of the polymeric fluorescent substance 11 are shown below.

(chemical formulae 32)

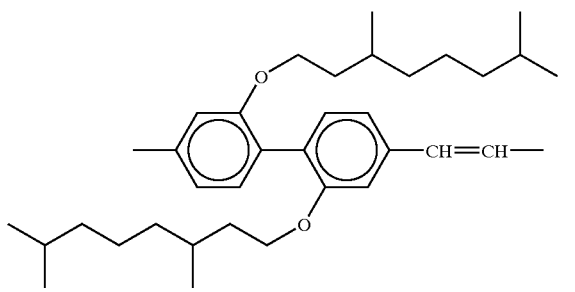

(chemical formulae 33)

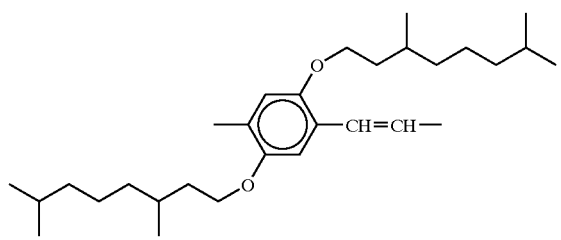

Example 11

<Synthesis of Polymeric Fluorescent Substance 12>

4,4'-dibromo-2,2'-bis(3,7-dimethyloctyloxy)stilbene, 1,4-bis(4-bromo-2-(3,7 -dimethyloctyloxy)phenylethenyl)-2,5-bis(3,7-dimethyloctyloxy)benzene, 9,9-bis(3,7-dimethyloctyl)fluorene-2,7-bis(propyl borate) are charged at a molar ratio of 1:0.96:0.04, and polymerized by Suzuki coupling reaction. The resulted polymer is called a polymeric fluorescent substance 12.

This polymeric fluorescent substance 12 is a random copolymer of 3-(3,7-dimethyloctyloxy)phenylene-9,9-bis(3, 7-dimethyloctyl)fluorene-2,7-diyl-2-(3,7-dimethyloctyloxy) phenylenevinylene and 2,5-bis(3,7-dimethyloctylocy)phenylenevinylene.

The structural formulae of repeating units of the polymeric fluorescent substance 12 are shown below.

(chemical formulae 34)

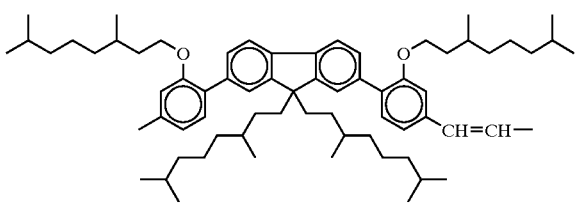

(chemical formulae 35)

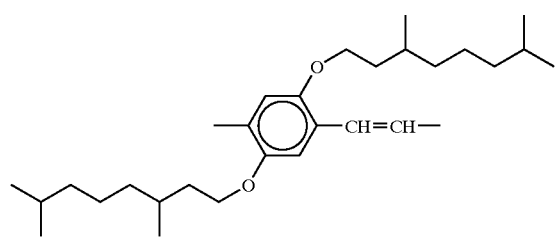

The polymeric fluorescent substance having a specific repeating unit of the present invention has strong fluorescence, and can be suitably used as a polymer LED and a dye for laser. Further, a polymer LED obtained by using this polymeric fluorescent substance shows lower voltage and high electoluminescent efficiency. Therefore, the polymer LED can be suitably applied as back-light of a liquid crystal display device or a light source in curved or plane form for illumination, and a display device such as a flat panel display of segment type or of dot matrix, and the like.

What is claimed is:

1. A polymeric fluorescent substance which emits a fluorescence in solid state and has a number-average molecular weight of $10^3$ to $10^8$ in terms of polystyrene, wherein the substance contains two repeating units represented by the following formula (1) and formula (3), and these repeating units are so selected as to satisfy the following conditions (a) to (c):

(a): the total amount of the repeating units represented by the formulae (1) and (3) is 50 mol % or more of the amount of the whole repeating units, (b): the amount of the repeating unit represented by the formula (3) is more than 0.1 mol % and less than 9 mol % based on the total amount of the repeating units represented by the formula (1) and formula (3), and (c): when the absorption edge wavelength of a polymer solely composed of a repeating unit represented by the formula (1) is represented by $\lambda_1$ (nm) and the absorption edge wavelength of a polymer solely composed of a repeating unit represented by the formula (3) is represented by $\lambda_2$ (nm), the following relation is satisfied:

$$1239/\lambda_1 \geq 1239/\lambda_2 + 0.05$$

  (1)

in the formula, $Ar_1$ is a group represented by the following formula (5); $R_1$ and $R_2$ each independently represents a group selected from the group consisting of a hydrogen atom, alkyl group having 1 to 20 carbon atoms, aryl group having 6 to 60 carbon atoms, heterocyclic compound group having 4 to 60 carbon atoms and cyano group; and n is 0 or 1,

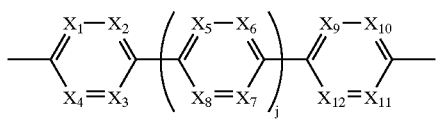  (5)

in the formula, $X_1$ to $X_{12}$ each independently represents C—$R_7$; wherein, each $R_7$ independently represents a group selected from the group consisting of a hydrogen atom, alkyl group having 1 to 20 carbon atoms, alkoxy group having 1 to 20 carbon atoms, alkylthio group having 1 to 20 carbon atoms, alkylsilyl group having 1 to 60 carbon atoms, alkylamino group having 1 to 40 carbon atoms, aryl group having 6 to 60 carbon atoms, aryloxy group having 6 to 60 carbon atoms, arylalkyl group having 7 to 60 carbon atoms, arylalkoxy group having 7 to 60 carbon atoms, arylalkenyl group having 8 to 60 carbon atoms, arylalkynyl group having 8 to 60 carbon atoms, arylamino group having 6 to 60 carbon atoms, heterocyclic compound group having 4 to 60 carbon atoms and cyano group; at least one $R_7$ is a group other than a hydrogen atom; adjacent 6-membered rings may be mutually connected directly or via a substituent to form a ring; j is an integer from 0 to 3; wherein, $X_1$ and $X_9$, $X_2$ and $X_{10}$, $X_3$ and $X_{11}$, and $X_4$ and $X_{12}$ are not respectively the same simultaneously, and $X_1$ and $X_{12}$, $X_2$ and $X_{11}$, $X_3$ and $X_{10}$, and $X_4$ and $X_9$ are not respectively the same simultaneously,

  (3)

in the formula, $Ar_5$ represents an arylene group having 6 to 60 carbon atoms contained in the main chain; $R_3$ and $R_4$ each independently represents a group selected from the group consisting of a hydrogen atom, alkyl group having 1 to 20 carbon atoms, aryl group having 6 to 60 carbon atoms, heterocyclic compound group having 4 to 60 carbon atoms and cyano group; l is 1.

2. The polymeric fluorescent substance according to claim 1 wherein j=0 in said formula (5).

3. A polymer light emitting device comprising a pair of electrodes composed of an anode and a cathode at least one of which is transparent or semitransparent and at least one light emitting layer disposed between the electrodes, wherein the polymeric fluorescent substance of any one of claims 1 and 2 is contained in said light emitting layer.

4. The polymer light emitting device according to claim 3 wherein a layer containing a conducting polymer is disposed at least between one electrode and the light emitting layer so that the layer containing a conducting polymer is adjacent to said electrode.

5. The polymer light emitting device according to claim 3 wherein an insulation layer having a thickness of 2 nm or less is disposed at least between one electrode and the light emitting layer so that the insulation layer is adjacent to said electrode.

6. The polymer light emitting device according to claim 3, wherein a layer comprising an electron transporting compound is disposed between the cathode and the light emitting layer so that the layer comprising an electron transporting compound is adjacent to said light emitting layer.

7. The polymer light emitting device according to claim 3, wherein a layer comprising a hole transporting compound is disposed between the anode and the light emitting layer so that the layer comprising a hole transporting compound is adjacent to said light emitting layer.

8. The polymer light emitting device according to claim 3, wherein a layer comprising an electron transporting compound is disposed between the cathode and the light emitting layer so that the layer comprising an electron transporting compound is adjacent to said light emitting layer, and a layer comprising a hole transporting compound is disposed between the anode and the light emitting layer so that the layer comprising a hole transporting compound is adjacent to said light emitting layer.

9. A flat light source obtained by using the polymer light emitting device of claim 3.

10. A segment display obtained by using the polymer light emitting device of claim 3.

11. A dot matrix display obtained by using the polymer light emitting device of claim 3.

12. A liquid crystal display obtained by using the polymer light emitting device of claim 3 as a back-light.

\* \* \* \* \*